(12) United States Patent
Pan et al.

(10) Patent No.: US 9,638,982 B2
(45) Date of Patent: May 2, 2017

(54) DEEP ULTRAVIOLET NON-LINEAR OPTICAL CRYSTAL OF BARIUM BORATE HYDRATE, PREPARATION METHOD THEREFOR AND USE THEREOF

(71) Applicant: XINJIANG TECHNICAL INSTITUTE OF PHYSICS AND CHEMISTRY, CHINESE ACADEMY OF SCIENCES, Urumqi, Xinjiang (CN)

(72) Inventors: Shilie Pan, Urumqi (CN); Xiangzhan Jiang, Urumqi (CN); Jian Han, Urumqi (CN)

(73) Assignee: Xinjiang Technical Institute of Physics and Chemstry, Chinese Academy of Sciences, Xinjiang (CN)

( * ) Notice: Subject to any disclaimer, the term of this patent is extended or adjusted under 35 U.S.C. 154(b) by 0 days.

(21) Appl. No.: 14/902,232

(22) PCT Filed: Jan. 23, 2014

(86) PCT No.: PCT/CN2014/071241
§ 371 (c)(1),
(2) Date: Dec. 30, 2015

(87) PCT Pub. No.: WO2015/058477
PCT Pub. Date: Apr. 30, 2015

(65) Prior Publication Data
US 2016/0145769 A1 May 26, 2016

(30) Foreign Application Priority Data

Oct. 23, 2013 (CN) .......................... 2013 1 0504643

(51) Int. Cl.
*G02F 1/35* (2006.01)
*G02F 1/355* (2006.01)
(Continued)

(52) U.S. Cl.
CPC .......... *G02F 1/3551* (2013.01); *C01B 35/126* (2013.01); *C30B 7/10* (2013.01); *C30B 7/14* (2013.01); *C30B 29/22* (2013.01)

(58) Field of Classification Search
CPC .............................. G02F 1/3551; C30B 29/22
See application file for complete search history.

(56) References Cited

U.S. PATENT DOCUMENTS 8,545,785 B2 * 10/2013 Pan .......................... C30B 9/12
  359/236
8,730,563 B2 * 5/2014 Pan .......................... C30B 9/06
  359/326

FOREIGN PATENT DOCUMENTS

CN       101302647 A  * 11/2008  ............. C30B 29/22
CN       101775653 A  *  7/2010  ............. C30B 29/22

* cited by examiner

*Primary Examiner* — Daniel Petkovsek
(74) *Attorney, Agent, or Firm* — Lewis Roca Rothgerber Christie LLP

(57) ABSTRACT

Provided area deep ultraviolet non-linear optical crystal of barium borate hydrate, a preparation method therefor and the use thereof. The chemical formula of the crystal is $Ba_2B_{11}O_{22}H_7$, belonging to monoclinic system, with the space group thereof being $P2_1$, the crystal cell parameters thereof being a=6.7719(10) Å, b=21.1195(4) Å, c=6.8274 (10) Å, β=119.3950(10) °, and the molecular weight thereof being 752.65. The non-linear optical crystal of borate is obtained by means of programmed cooling or natural cooling using a hydrothermal method. The crystal powder has a frequency-doubled effect of about 2 times that of KDP ($KH_2PO_4$) and an ultraviolet cut-off edge of below 175 nm and can be used as a deep ultraviolet non-linear optical crystal. The growth process of the crystal has advantages such as simple, a low cost, a low toxicity, a short growth cycle, stable physical and chemical properties, etc. The deep (Continued)

ultraviolet non-linear optical crystal of barium borate hydrate $Ba_2B_{11}O_{22}H_7$ is widely used in the preparation of non-linear optical devices such as frequency doubling generators, upper frequency converters, lower frequency converters, optical parametric oscillators etc.

5 Claims, 1 Drawing Sheet

(51) Int. Cl.
    *C30B 7/10*         (2006.01)
    *C30B 29/22*      (2006.01)
    *C01B 35/12*      (2006.01)
    *C30B 7/14*         (2006.01)

DEEP ULTRAVIOLET NON-LINEAR OPTICAL CRYSTAL OF BARIUM BORATE HYDRATE, PREPARATION METHOD THEREFOR AND USE THEREOF

CROSS-REFERENCED TO RELATED APPLICATION(S)

This Application is a National Phase Patent Application of, and claims priority to and the benefit of International Application Number PCT/CN2014/071241, filed on Jan. 23, 2014, which claims priority to and the benefit of Chinese Application Number 201310504643.5, filed Oct. 23, 2013, the entire contents of all of which are incorporated herein by reference.

FIELD OF THE INVENTION

The present invention belongs to the fields of materials science and optics in the inorganic chemistry field, particularly relates a deep ultraviolet non-linear optical crystal of barium borate hydrate having a chemical formula of $Ba_2B_{11}O_{22}H_7$, and a preparation method and use thereof.

BACKGROUND OF THE INVENTION

Discovery of laser has brought great changes to human civilization. In 1960, Maiman succeeded in producing the first ruby laser in the world. Since the laser has characteristics such as high energy density, high directivity and coherence, it has a wide range of applications in many areas and has been combined with a number of disciplines to form several application technologies, such as photovoltaic technology, laser medical treatment and photobiology, laser processing, laser detection and measurement technology, laser holography, laser radar, laser guidance, laser isotope separation, laser controlled nuclear fusion, laser weapons, and so on. The laser obtained directly by using a laser crystal is limited in wave band, while using the frequency conversion crystals can convert a laser at a limited wavelength into a laser in a new band, which is a key means of obtaining new laser sources. However, the key issue of achieving high-efficiency conversion in laser wavelength is the availability of a high-quality and excellent-performance non-linear optical crystal.

In 1961, Franken et al. observed the frequency-doubled effect in the quartz crystal for the first time, which not only marked the naissance of the non-linear optical discipline, but also strongly promoted the development of non-linear optical material science. Non-linear optical crystal has frequency conversion effect, electro-optic effect, photorefractive effect etc., and can be used in the fields of laser frequency conversion, electro-optical modulation, signal processing and the like. It is an important basic material for the growing optoelectronics industry and an important mainstay for the development of solid-state laser technology, infrared technology, optical communication and information processing and other fields, and is playing a more and more important role in scientific research, industries, transportation, national defense, health care and the like. Over the past decade, although the non-linear optical crystals for blue/green light and ultraviolet (UV) and deep ultraviolet (DUV) have attracted broad attention, these crystals have their limitations and have been difficult to obtain a wider range of applications. For example, the $\beta$-$BaB_2O_4$ (BBO) crystal has photorefractive effect at its quadruplicated frequency, which hinders the application of quadruplicated frequency. Additionally, the $\beta$-$BaB_2O_4$ (BBO) crystal has a small receiving angle and a large walk-off angle, so in order to obtain high conversion efficiency, it is required that the pump laser beam has good beam quality (low divergence angle and good mode). The BBO crystal would be deliquescent to some extent, causing some inconvenience while using. The $LiB_3O_5$ (LBO) crystal is deliquescent to some extent as well. Neither of these two crystals can generate a light below 200 nm by direct frequency doubling. The layers of the $KBe_2BO_3F_2$ (KBBF) crystal are associated with each other via ionic bonds between K and F, i.e. the bonding force between the layers is weak, for this reason, it has a strong layer-by-layer growth habit and is difficult to grow thick, difficult to process and easy to dissociate, and thus difficult for practical use. Therefore, there is an urgent need to develop a practical new non-linear optical crystal having better performance and matching shorter wave band, and many countries around the world are actively looking for such a new non-linear optical crystal.

In recent years, when developing new non-linear optical crystals, it is not only focused on the optical and mechanical properties, but also more emphasizing on the preparation characteristics. It is hoped that the new crystal materials are easy to prepare so as to obtain low-price, high-quality and large-size non-linear optical crystals. Under the guide of the design concept of introducing alkaline earth metal cations into the boron-oxygen framework to improve the performance, the anions, taking boron-oxygen primitives as the foundation, have large band gaps, small probability of two-photon absorption and high laser damage threshold, and is helpful to obtain strong non-linear optical effects; the B—O bonds facilitate transmission of broad band light. The cations selecting from alkaline earth metal ions have no transition of $d_0$ electrons in the ultraviolet region, which is conductive to ultraviolet transmission.

SUMMARY OF THE INVENTION

The objective of the present invention is to provide a transparent deep ultraviolet non-linear optical crystal of barium borate hydrate $Ba_2B_{11}O_{22}H_7$ in order to fill in the spectrum blank in wavelengths of the lasers emitted by various laser devices.

Another objective of the present invention is to provide a method for preparing the deep ultraviolet non-linear optical crystal of barium borate hydrate $Ba_2B_{11}O_{22}H_7$ in an easy and simple way of using a hydrothermal method.

Yet another objective of the present invention is to provide a use of the $Ba_2B_{11}O_{22}H_7$ non-linear optical device.

The technical schemes of the present invention are described as follows:

The deep ultraviolet non-linear optical crystal of barium borate hydrate provided in the present invention has a chemical formula of $Ba_2B_{11}O_{22}H_7$, belongs to the monoclinic system, has a space group of $P2_1$, with lattice parameters of a=6.7719(10) Å, b=21.1195(4) Å, c=6.8274(10) Å, $\beta$=119.3950(10)° and a molecular weight of 752.65.

The method for preparing said deep ultraviolet non-linear optical crystal of barium borate hydrate $Ba_2B_{11}O_{22}H_7$ uses the hydrothermal method to prepare the crystals, and is conducted specifically according to the following steps:

(a) $BaCl_2$, $Ba(CH_3COO)_2 \cdot H_2O$, $BaSO_4$, $Ba(ClO_4)_2$, $BaCO_3$ or $Ba(NO_3)_2$ is added into the polytetrafluoroethylene liner of a 23-125 ml, high-pressure reactor, $H_3BO_3$ or $B_2O_3$ is then added, and then 8-70 mL of deionized water is added, followed by mixing uniformly to obtain a mixture solution;

In Step (a), the molar ratio of $Ba^{2+}$ to $BO_3^{3-}$ is 1:0.3-6; the molar ratio of $Ba^{2+}$ to $B_2O_3$ is 1:0.15-3;

(b) Into the mixture solution of Step (a), a mineralizer lithium hydroxide, sodium hydroxide, potassium hydroxide, ammonia or ethylenediamine is added and mixed, wherein the volume ratio of mineralizer to mixture solution is 1:2-70;

(c) The lid of the polytetrafluoroethylene liner charged with the mixture solution of Step (b) is tightened, and then the polytetrafluoroethylene liner is loaded into the corresponding high-pressure reactor, followed by tightening the piston of the reactor;

(d) The high-pressure reactor of Step (c) is placed in a thermotank, heated to 120-210° C. at a rate of 20-60° C./h, held at this temperature for 3-25 days, and then cooled to room temperature by slow cooling at a rate of 1-50° C./h or natural cooling;

(e) The high-pressure reactor is opened and the solution containing the crystal is filtered to obtain a transparent non-linear optical crystal of barium borate hydrate $Ba_2B_{11}O_{22}H_7$ as analyzed and identified by X-Ray Single Crystal Diffactometer.

In Step (c), the solution is placed in a clean and contamination-free high-pressure reactor.

The deep ultraviolet non-linear optical crystal of barium borate hydrate $Ba_2B_{11}O_{22}H_7$ in the present invention is prepared by the hydrothermal method according to the following chemical reaction equations:

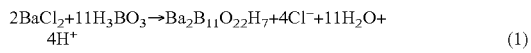   (1)

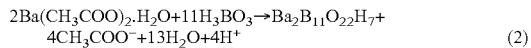   (2)

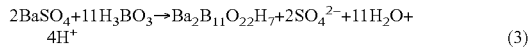   (3)

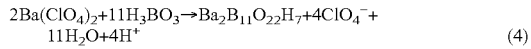   (4)

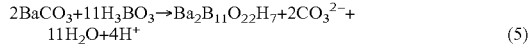   (5)

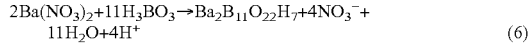   (6)

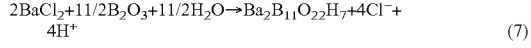   (7)

   (8)

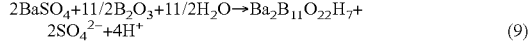   (9)

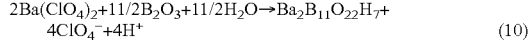   (10)

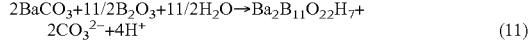   (11)

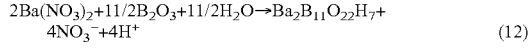   (12)

The present invention provides a use of the deep ultraviolet non-linear optical crystal of barium borate hydrate $Ba_2B_{11}O_{22}H_7$, wherein the non-linear optical crystal of barium borate hydrate $Ba_2B_{11}O_{22}H_7$ is used for preparing non-linear optical devices, including frequency doubling generator, upper frequency converter, lower frequency converter, optical parametric oscillator, that is allowing for transmission of at least one beam of fundamental wave of incident light to generate at least one beam of coherent light at a different frequency from the incident light.

The invention has the following advantages:

The deep ultraviolet non-linear optical crystal of barium borate hydrate $Ba_2B_{11}O_{22}H_7$ provided in the present invention has an ultraviolet cutoff edge of below 175 nm, a non-linear optical effect of about 2 times as much as that of KDP, a space group of $P2_1$. For the crystal, the preparation is simple, the growth cycle is short, and the starting material used has low toxicity and little poison to human. The method for preparing the crystal comprises mixing the starting materials at a certain ratio, using the hydrothermal method to allow for a high-temperature and high-pressure reaction in a sealed reactor at a certain temperature range and then obtain the transparent deep ultraviolet non-linear optical crystal of barium borate hydrate $Ba_2B_{11}O_{22}H_7$ in a way of programmed cooling or holding at constant temperature, wherein the process is simple and easy to operate. The resulting deep ultraviolet non-linear optical crystal of barium borate hydrate $Ba_2B_{11}O_{22}H_7$ has no special requirement for the precision of optical processing and can be used to prepare non-linear optical devices, including frequency doubling generator, upper frequency converter, lower frequency converter or optical parametric oscillator.

EXAMPLES

Figure 1:
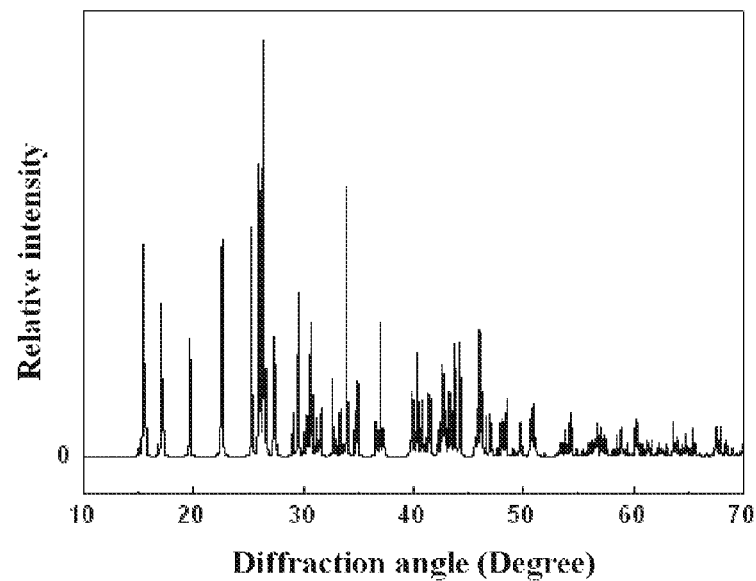
FIG. 1 shows an X-ray diffraction pattern of barium borate hydrate of the present invention.

The present invention will be described in details hereinafter in combination of the accompanying drawings and the following examples:

Example 1

The crystal was prepared according to

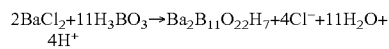

and the specific procedure as follows:

(a) According to a molar ratio of $BaCl_2:H_3BO_3=1:4$, $BaCl_2$ was added into the polytetrafluoroethylene liner of a 23 mL high-pressure reactor. $H_3BO_3$ was then added, and then 10 mL of deionized water was added, followed by mixing uniformly to obtain a mixture solution;

(b) Into the mixture solution of Step (a), a mineralizer 1 mL of 3 mol/L LiOH solution was added and mixed, wherein the volume ratio of the mineralizer to the mixture solution was 1:10;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 180° C. at a rate of 20° C./h, held at this temperature for 3 days, followed by slowly cooling to room temperature at a rate of 2° C./h;

(e) The high-pressure reactor was opened and the solution containing the crystal was filtered repeatedly to obtain a relatively transparent $Ba_2B_{11}O_{22}H_7$ non-linear optical crystal as analyzed and identified by X-Ray Single Crystal Diffactometer.

Example 2

The crystal was prepared according to $$2Ba(CH_3COO)_2 \cdot H_2O + 11H_3BO_3 \rightarrow Ba_2B_{11}O_{22}H_7 + 4CH_3COO^- + 13H_2O + 4H^+$$

and the specific procedure as follows:

(a) According to a molar ratio of $Ba(CH_3COO)_2 \cdot H_2O:H_3BO_3=1:2$, $Ba(CH_3COO)_2 \cdot H_2O$ was added into the polytetrafluoroethylene liner of a 80 mL high-pressure reactor, $H_3BO_3$ was then added, and then 35 mL of deionized water was added, followed by mixing uniformly to obtain a mixture solution;

(b) Into the mixture solution of Step (a), a mineralizer 0.5 mL of 3 mol/L NaOH solution was added and mixed, wherein the volume ratio of the mineralizer to the mixture solution was 1:70;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 200° C. at a rate of 30° C./h, held at this temperature for 6 days, followed by naturally cooling to room temperature;

(e) The high-pressure reactor was opened and the solution containing the crystal was filtered repeatedly to obtain a relatively transparent $Ba_2B_{11}O_{22}H_7$ non-linear optical crystal as analyzed and identified by X-Ray Single Crystal Diffactometer.

Example 3

The crystal was prepared according to $$2BaSO_4 + 11H_3BO_3 \rightarrow Ba_2B_{11}O_{22}H_7 + 2SO_4^{2-} + 11H_2O + 4H^+$$

and the specific procedure as follows:

(a) According to a molar ratio of $BaSO_4:H_3BO_3=1:6$, $BaSO_4$ was added into the polytetrafluoroethylene liner of a 23 mL high-pressure reactor, $H_3BO_3$ was then added, and then 10 mL of deionized water was added, followed by mixing uniformly to obtain a mixture solution;

(b) Into the mixture solution of Step (a), a mineralizer 0.5 mL of 3 mol/L KOH solution was added and mixed, wherein the volume ratio of the mineralizer to the mixture solution was 1:20;

(c) The lid of the polytetrafluoroethylene liner charged with the mixture solution of Step (b) tightened, and then the polytetrafluoroethylene liner was loaded into the corresponding clean and contamination-free high-pressure reactor, followed by tightening the piston of the high-pressure reactor;

(d) The high-pressure reactor of Step (c) was placed in a thermotank, heated to 210° C. at a rate of 50° C./h, held at this temperature for 10 days, followed by slowly cooling to room temperature at a rate of 30° C./h;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer, Example 4

The crystal was prepared according to $$2Ba(ClO_4)_2 + 11H_3BO_3 \rightarrow Ba_2B_{11}O_{22}H_7 + 4ClO_4^- + 11H_2O + 4H^+$$

and the specific procedure as follows:

(a) According to a molar ratio of $Ba(ClO_4)_2:H_3BO_3=1:5$, $Ba(ClO_4)_2$ was added into the polytetrafluoroethylene liner of a 125 mL high-pressure reactor, $H_3BO_3$ was then added, and then 70 mL of deionized water was added, followed by mixing uniformly to obtain a mixture solution;

(b) Into the mixture solution of Step (a), a mineralizer 5 mL of ethylenediamine was added and mixed, wherein the volume ratio of the mineralizer to the mixture solution was 1:14;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 120° C. at a rate of 25° C./h, held at this temperature for 25 days, followed by naturally cooling to room temperature;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 5

The crystal was prepared according to $$2BaCO_3 + 11H_3BO_3 \rightarrow Ba_2B_{11}O_{22}H_7 + 2CO_3^{2-} + 11H_2O + 4H^+$$

and the specific procedure as follows:

(a) According to a molar ratio of $BaCO_3:H_3BO_3=1:6$, $BaCO_3$ was added into the polytetrafluoroethylene liner of a 23 mL high-pressure reactor, $H_3BO_3$ was then added, and then 10 mL of deionized water was added, followed by mixing uniformly to obtain a mixture solution;

(b) Into the mixture solution of Step (a), a mineralizer 5 mL of ammonia was added and mixed, wherein the volume ratio of the mineralizer and the mixture solution was 1:2;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 210° C. at a rate of 40° C./h, held at this temperature for 6 days, followed by slowly cooling to room temperature at a rate of 25° C./h;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 6

The crystal was prepared according to $$2Ba(NO_3)_2 + 11H_3BO_3 \rightarrow Ba_2B_{11}O_{22}H_7 + 4NO_3^- + 11H_2O + 4H^+$$

and the specific procedure as follows:

(a) According to a molar ratio of $Ba(NO_3)_2:H_3BO_3=1:0.3$, $Ba(NO_3)_2$ was added into the polytetrafluoroethylene liner of a 23 mL high-pressure reactor, $H_3BO_3$ was then added, and then 10 mL of deionized water was added, followed by mixing uniformly to obtain a mixture solution;

(b) Into the mixture solution of Step (a), a mineralizer 0.5 mL of KOH was added and mixed, wherein the volume ratio of the mineralizer to the mixture solution was 1:20;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 210° C. at a rate of 40° C./h, held at this temperature for 6 days, followed by slowly cooling to room temperature at a rate of 25° C./h;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 7

The crystal was prepared according to

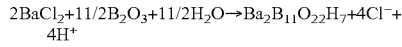
$$2BaCl_2+11/2B_2O_3+11/2H_2O \rightarrow Ba_2B_{11}O_{22}H_7+4Cl^-+4H^+$$

and the specific procedure as follows:

(a) According to a molar ratio of $BaCl_2:B_2O_3=1:2$, $BaCl_2$ was added was added into the polytetrafluoroethylene liner of a 23 mL high-pressure reactor, $B_2O_3$ was then added, and then 10 mL of deionized water was added, followed by mixing uniformly to obtain a mixture solution;

(b) Into the mixture solution of Step (a), a mineralizer 1 mL of 3 mol/L LiOH solution was added and mixed, wherein the volume ratio of the mineralizer and the mixture solution was 1:10;

(c) The lid of the polytetrafluoroethylene liner charged with the mixture solution of step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 180° C. at a rate of 20° C./h, increased, held at this temperature for 3 days, followed by slowly cooling to room temperature at a rate of 2° C./h;

(e) The high-pressure reactor was opened and the solution containing the crystal was filtered repeatedly to obtain a relatively transparent $Ba_2B_{11}O_{22}H_7$ non-linear optical crystal as analyzed and identified by X-Ray Single Crystal Diffactometer.

Example 8

The crystal was prepared according to

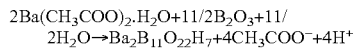
$$2Ba(CH_3COO)_2 \cdot H_2O+11/2B_2O_3+11/2H_2O \rightarrow Ba_2B_{11}O_{22}H_7+4CH_3COO^-+4H^+$$

and the specific procedure as follows:

(a) According to a molar ratio of $Ba(CH_3COO)_2 \cdot H_2O:B_2O_3=1:1$, $Ba(CH_3COO)_2 \cdot H_2O$ was added into the polytetrafluoroethylene liner of a 80 mL high-pressure reactor, $B_2O_3$ was then added, and then 35 mL of deionized water was added, followed by mixing uniformly to obtain a mixture solution;

(b) Into the mixture solution of Step (a), a mineralizer 0.5 mL of 3 mol/L NaOH solution was added and mixed, wherein the volume ratio of the mineralizer and the mixture solution was 1:70;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 200° C. at a rate of 30° C./h, held at this temperature for 6 days, followed by naturally cooling to room temperature;

(e) The high-pressure reactor was opened and the solution containing the crystal was filtered repeatedly to obtain a relatively transparent $Ba_2B_{11}O_{22}H_7$ non-linear optical crystal as analyzed and identified by X-Ray Single Crystal Diffactometer.

Example 9

The crystal was prepared according to

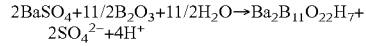
$$2BaSO_4+11/2B_2O_3+11/2H_2O \rightarrow Ba_2B_{11}O_{22}H_7+2SO_4^{2-}+4H^+$$

and the specific procedure as follows:

(a) According to a molar ratio of $BaSO_4:B_2O_3=1:3$. $BaSO_4$ was added into the polytetrafluoroethylene liner of a 23 mL high-pressure reactor, $B_2O_3$ was then added, and then 10 mL of deionized water was added, followed by mixing uniformly to obtain a mixture solution;

(b) Into the mixture solution of Step (a), a mineralizer 0.5 mL of 3 mol/L KOH solution was added and mixed, wherein the volume ratio of the mineralizer and the mixture solution was 1:20;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 210° C. at a rate of 50° C./h, held at this temperature for 10 days, followed by slowly cooling to room temperature at a rate of 30° C./h;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 10

The crystal was prepared according to

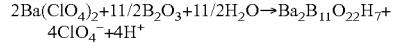
$$2Ba(ClO_4)_2+11/2B_2O_3+11/2H_2O \rightarrow Ba_2B_{11}O_{22}H_7+4ClO_4^-+4H^+$$

and the specific procedure as follows:

(a) According to a molar ratio of $Ba(ClO_4)_2:B_2O_3=1:2.5$, $Ba(ClO_4)_2$ was added into the polytetrafluoroethylene liner of a 125 mL high-pressure reactor, $B_2O_3$ was then added, and then 70 mL of deionized water was added, followed by mixing uniformly to obtain a mixture solution;

(b) Into the mixture solution of Step (a), a mineralizer 5 mL of ethylenediamine was added and mixed, wherein the volume ratio of the mineralizer and the mixture solution was 1:14;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 120° C. at a rate of 25° C./h, held at this temperature for 25 days, followed by naturally cooling to room temperature;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 11

The crystal was prepared according to

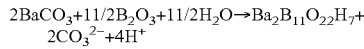
$2BaCO_3+11/2B_2O_3+11/2H_2O \rightarrow Ba_2B_{11}O_{22}H_7 + 2CO_3^{2-}+4H^+$ and the specific procedure as follows:

(a) According to a molar ratio of $BaCO_3:B_2O_3=1:3$, $BaCO_3$ was added into the polytetrafluoroethylene liner of a 23 mL high-pressure reactor, $B_2O_3$ was then added, and then 10 mL of deionized water was added, followed by mixing uniformly to obtain a mixture solution;

(b) Into the mixture solution of Step (a), a mineralizer 5 mL of ammonia was added and mixed, wherein the volume ratio of the mineralizer and the mixture solution was 1:2;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 210° C. at a rate of 40° C./h, increased, held at this temperature for 6 days, followed by slowly cooling to room temperature at a rate of 25° C./h;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 12

The crystal was prepared according to

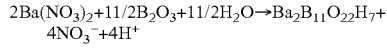
$2Ba(NO_3)_2+11/2B_2O_3+11/2H_2O \rightarrow Ba_2B_{11}O_{22}H_7 + 4NO_3^-+4H^+$ and the specific procedure as follows:

(a) According to a molar ratio of $Ba(NO_3)_2:B_2O_3=1:0.15$, $Ba(NO_3)_2$ was added into the polytetrafluoroethylene liner of a 23 mL high-pressure reactor, $B_2O_3$ was then added, and then 10 mL of deionized water was added, followed by mixing uniformly to obtain a mixture solution;

(b) Into the mixture solution of Step (a), a mineralizer 0.5 mL of KOH was added and mixed, wherein the volume ratio of the mineralizer and the mixture solution was 1:20;

(c) The lid of the polytetrafluoroethylene liner charged with the mixture solution of Step (b) was tightened, and then the polytetrafluoroethylene liner was loaded into the corresponding clean and contamination-free high-pressure reactor, followed by tightening the piston of the reactor;

(d) The high-pressure reactor of Step (c) was placed in a thermotank, heated to 210° C. at a rate of 40° C./h, held at this temperature for 6 days, followed by slowly cooling to room temperature at a rate of 25° C./h;

(e) The high-pressure reactor was opened and the solution containing the crystal was filtered to obtain a transparent $Ba_2B_{11}O_{22}H_7$ non-linear optical crystal as analyzed and identified by X-Ray Single Crystal Diffactometer.

Example 13

Figure 2:
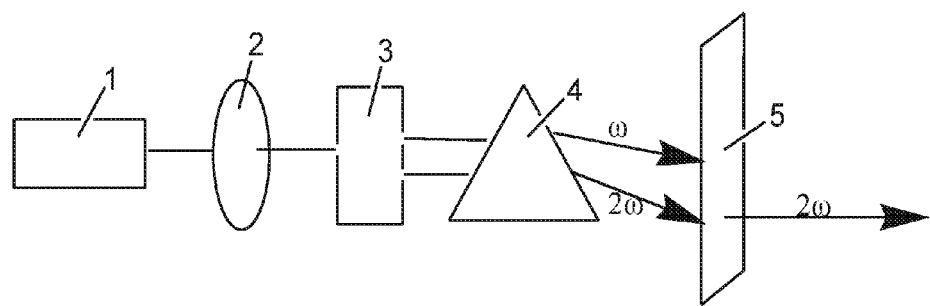
FIG. 2 is a diagram of the working principle of the non-linear optical device prepared in the present invention, wherein 1 is a laser generator, 2 is a convex lens, 3 is deep ultraviolet non-linear optical crystal of barium borate hydrate $Ba_2B_{11}O_{22}H_7$, 4 is a beam splitter prism and 5 is a filter, and ω is refracted light frequency, equal to incident light frequency or 2 times as much as incident light frequency.

Any one of the non-linear optical crystals obtained in Examples 1-12 was arranged at the position (3) as shown in FIG. 2. At room temperature, when a Q-switched Nd:YAG laser generator with a setting of 1,064 nm was used as light source, it was observed that clear frequency-doubled green light at 532 nm was output, the output intensity of which was twice of that of KDP under the same conditions;

As shown in FIG. 2, Q-switched Nd:YAG laser generator 1 emitted an infrared light at a wavelength of 1,064 nm, which then entered the $Ba_2B_{11}O_{22}H_7$ non-linear optical crystal after passing through the convex lens 2, and then a frequency-doubled green light at a wavelength of 532 nm was generated. The output light beam 4 comprised both the infrared light at a wavelength of 1,064 nm and the green light at wavelength of 532 nm. After filtration by filter 5, the frequency-doubled light at a wavelength of 532 nm was obtained.

The invention claimed is:

1. A deep ultraviolet non-linear optical crystal of barium borate hydrate, having a formula of $Ba_2B_{11}O_{22}H_7$, belonging to the monoclinic system, having a space group of $P2_1$, with lattice parameters of a=6.7719(10) Å, b=21.1195 (4) Å, c=6.8274(10) Å, β=119.3950(10)°, and a molecular weight of 752.65.

2. A method for preparing the deep ultraviolet non-linear optical crystal of barium borate hydrate according to claim 1, wherein it uses a hydrothermal method and is conducted specifically according to the following steps:

(a) $BaCl_2$, $Ba(CH_3COO)_2 \cdot H_2O$, $BaSO_4$, $Ba(ClO_4)_2$, $BaCO_3$ or $Ba(NO_3)_2$ is added into the polytetrafluoroethylene liner of a 23-125 mL high-pressure reactor, $H_3BO_3$ or $B_2O_3$ is then added, and then 8-70 mL of deionized water is added, followed by mixing uniformly to obtain a mixture solution;

In said Step (a), the molar ratio of $Ba^{2+}$ to $BO_3^{3-}$ is 1:0.3-6; the molar ratio of $Ba^{2+}$ to $B_2O_3$ is 1:0.15-3;

(b) into the mixture solution of Step (a), a mineralizer lithium hydroxide, sodium hydroxide, potassium hydroxide, ammonia or ethylenediamine is added and mixed, wherein the volume ratio of mineralizer and mixture solution is 1:2-70;

(c) The lid of the polytetrafluoroethylene liner charged with the mixture solution of Step (b) is tightened, and then the polytetrafluoroethylene liner is loaded into the corresponding high-pressure reactor, followed by tightening the piston of the reactor;

(d) The high-pressure reactor of Step (c) is placed in a thermotank, heated to 120-210° C. at a rate of 20-60° C./h, held at this temperature for 3-25 days, and then cooled to room temperature by slow cooling at a rate of 1-50° C./h or natural cooling;

(e) The high-pressure reactor is opened and the solution containing the crystal is filtered to obtain a transparent crystal, which is deep ultraviolet non-linear optical crystal of barium borate hydrate $Ba_2B_{11}O_{22}H_7$ as analyzed and identified by X-Ray Single Crystal Diffactometer.

3. The method for preparing the deep ultraviolet non-linear optical crystal of barium borate hydrate according to claim 2, wherein the high-pressure reactor of said Step (c) is a clean and contamination-free high-pressure reactor.

4. The method for preparing the deep ultraviolet non-linear optical crystal of barium borate hydrate according to claim 2, wherein it is conducted by using the hydrothermal method according to the following chemical reaction equations:

$$2BaCl_2+11H_3BO_3 \rightarrow Ba_2B_{11}O_{22}H_7+4Cl^-+11H_2O+4H^+ \quad (1)$$

$$2Ba(CH_3COO)_2 \cdot H_2O+11H_3BO_3 \rightarrow Ba_2B_{11}O_{22}H_7+4CH_3COO^-+13H_2O+4H^+ \quad (2)$$

$$2BaSO_4+11H_3BO_3 \rightarrow Ba_2B_{11}O_{22}H_7+2SO_4^{2-}+11H_2O+4H^+ \quad (3)$$

$$2Ba(ClO_4)_2+11H_3BO_3 \rightarrow Ba_2B_{11}O_{22}H_7+4ClO_4^-+11H_2O+4H^+ \quad (4)$$

$$2BaCO_3+11H_3BO_3 \rightarrow Ba_2B_{11}O_{22}H_7+2CO_3^{2-}+11H_2O+4H^+ \quad (5)$$

$$2Ba(NO_3)_2+11H_3BO_3 \rightarrow Ba_2B_{11}O_{22}H_7+4NO_3^-+11H_2O+4H^+ \quad (6)$$

$$2BaCl_2+11/2B_2O_3+11/2H_2O \rightarrow Ba_2B_{11}O_{22}H_7+4Cl^-+4H^+ \quad (7)$$

$$2Ba(CH_3COO)_2+11/2B_2O_3+11/2H_2O \rightarrow Ba_2B_{11}O_{22}H_7+4CH_3COO^-+4H^+ \quad (8)$$

$$2BaSO_4+11/2B_2O_3+11/2H_2O \rightarrow Ba_2B_{11}O_{22}H_7+2SO_4^{2-}+4H^+ \quad (9)$$

$$2Ba(ClO_4)_2+11/2B_2O_3+11/2H_2O \rightarrow Ba_2B_{11}O_{22}H_7+4ClO_4^-+4H^+ \quad (10)$$

$$2BaCO_3+11/2B_2O_3+11/2H_2O \rightarrow Ba_2B_{11}O_{22}H_7+2CO_3^{2-}+4H^+ \quad (11)$$

$$2Ba(NO_3)_2+11/2B_2O_3+11/2H_2O \rightarrow Ba_2B_{11}O_{22}H_7+4NO_3^-+4H^+ \quad (12).$$

5. A use of the deep ultraviolet non-linear optical crystal of barium borate hydrate $Ba_2B_{11}O_{22}H_7$ according to claim 2, wherein the non-linear optical crystal of barium borate hydrate $Ba_2B_{11}O_{22}H_7$ is used for preparing non-linear optical devices, including frequency doubling generator, upper frequency converter, lower frequency converter or optical parametric oscillator.

* * * * *

UNITED STATES PATENT AND TRADEMARK OFFICE
CERTIFICATE OF CORRECTION

PATENT NO. : 9,638,982 B2
APPLICATION NO. : 14/902232
DATED : May 2, 2017
INVENTOR(S) : Shilie Pan et al.

Page 1 of 1

It is certified that error appears in the above-identified patent and that said Letters Patent is hereby corrected as shown below:

On the Title Page

Item (73) Assignee, should read    Xinjiang Technical Institute of Physics and Chemistry, Chinese Academy of Sciences Item (57) Abstract, Line 1    Delete "Provided area deep", Insert --Provided are a deep--

Item (57) Abstract, Line 7    Delete "(10) °,", Insert --(10)°,--

In the Specification

Column 1, Line 6    Delete "CROSS-REFERENCED", Insert --CROSS-REFERENCE--

Column 1, Line 10    Delete "of, and claims", Insert --of and claims--

In the Claims

Column 10, Lines 60-61, Claim 2    Delete "Diffactometor", Insert --Diffractometer--

Signed and Sealed this
Fourth Day of December, 2018

Andrei Iancu
*Director of the United States Patent and Trademark Office*